US010582630B1

(12) United States Patent
Graham

(10) Patent No.: US 10,582,630 B1
(45) Date of Patent: Mar. 3, 2020

(54) METHOD AND APPARATUS FOR MANAGING STATIC ELECTRICITY

(71) Applicant: Roger Graham, Santa Barbara, CA (US)

(72) Inventor: Roger Graham, Santa Barbara, CA (US)

( * ) Notice: Subject to any disclaimer, the term of this patent is extended or adjusted under 35 U.S.C. 154(b) by 0 days.

(21) Appl. No.: 15/392,724

(22) Filed: Dec. 28, 2016

Related U.S. Application Data

(60) Provisional application No. 62/271,655, filed on Dec. 28, 2015.

(51) Int. Cl.
H05K 5/00 (2006.01)
H05K 5/02 (2006.01)

(52) U.S. Cl.
CPC .................. H05K 5/0247 (2013.01)

(58) Field of Classification Search
CPC ......... H02G 3/08; H05K 5/00; B60R 16/0239
See application file for complete search history.

(56) References Cited

U.S. PATENT DOCUMENTS

| 940,431 A | 11/1909 | Chapman |
| 1,262,173 A | 4/1918 | Chapman |
| 1,653,599 A | 12/1927 | Chapman |
| 2,053,114 A | 9/1936 | Sinks |
| 2,333,213 A | 11/1943 | Slater |
| 2,481,913 A | 9/1949 | Duchesneau |
| 2,514,864 A | 7/1950 | Herbert |
| 2,531,338 A | 11/1950 | Lobley |
| 2,752,533 A | 6/1956 | Maas |
| 2,969,484 A | 1/1961 | Suckow |
| 3,037,149 A | 5/1962 | Herbert |
| 3,099,774 A | 7/1963 | Crane |
| 3,120,626 A | 2/1964 | Schweriner |
| 3,416,033 A | 12/1968 | Hoover |
| 3,462,183 A | 8/1969 | Dudley |
| 3,585,448 A | 6/1971 | Simons |
| 3,603,811 A | 9/1971 | Day |
| 3,619,718 A | 11/1971 | Leonard |
| 3,621,164 A | 11/1971 | Backer |
| 3,711,742 A | 1/1973 | Pinkham |
| 3,745,412 A * | 7/1973 | Ruff .................. A61N 1/14 361/220 |
| 3,780,345 A | 12/1973 | Earman |
| 3,793,558 A | 2/1974 | Lindsay |
| 3,875,461 A | 4/1975 | Richardson |
| 3,917,978 A | 11/1975 | Menzel |

(Continued)

FOREIGN PATENT DOCUMENTS

WO PCT/FR1987/000239 12/1987

OTHER PUBLICATIONS

DE 10251329 A1 English Translation.*
Anmelder (DE 10251329 A1 English Translation).*

Primary Examiner — Pete T Lee
(74) Attorney, Agent, or Firm — Roger W. Graham

(57) ABSTRACT

Method and apparatus for mobile management and dispersion of static electricity which has accumulated upon a human being are disclosed. FIGS. 1 through 5 depict technical features which enable mobile, untethered, convenient, aesthetic, informative, and comfortable dispersion of static electricity, resulting in reduced physical pain, automated signaling of discharge characteristics, stylish adornments, and ease of use by the operator.

20 Claims, 15 Drawing Sheets

(56) References Cited

U.S. PATENT DOCUMENTS

| | | | |
|---|---|---|---|
| 4,057,071 A | 11/1977 | Rhodes | |
| 4,104,695 A * | 8/1978 | Hollis | H05F 3/00 |
| | | | 361/220 |
| 4,271,451 A | 6/1981 | Metz | |
| 4,319,303 A | 3/1982 | Thorn | |
| 4,345,297 A | 8/1982 | Check | |
| 4,459,633 A | 7/1984 | Vandermark | |
| 4,477,263 A | 8/1984 | Shaver | |
| 4,532,419 A * | 7/1985 | Takeda | G06K 19/07 |
| | | | 235/492 |
| 4,570,200 A * | 2/1986 | Osada | A61N 1/14 |
| | | | 361/212 |
| 4,586,106 A | 4/1986 | Frazier | |
| 4,633,364 A | 12/1986 | Nakamura | |
| 4,654,746 A | 3/1987 | Lewis | |
| 4,715,086 A | 12/1987 | Johanson | |
| 4,745,519 A | 5/1988 | Breidegam | |
| 4,766,903 A | 8/1988 | Esper | |
| 4,821,320 A | 4/1989 | Andert | |
| 4,849,851 A | 7/1989 | Cubbison | |
| 4,852,374 A | 8/1989 | Gotanda | |
| 4,858,061 A | 8/1989 | Hethcoat | |
| 5,036,423 A | 7/1991 | Williams | |
| 5,164,674 A | 11/1992 | Bakhoum | |
| 5,179,497 A | 1/1993 | Bakhoum | |
| 5,222,013 A | 6/1993 | Schwalm | |
| 5,281,155 A | 1/1994 | Comerci | |
| 5,283,710 A | 2/1994 | Hamilton | |
| 5,335,137 A | 8/1994 | English | |
| 5,768,086 A | 6/1998 | Abe | |
| 5,898,559 A | 4/1999 | Smith | |
| 5,901,022 A | 5/1999 | Ker | |
| 6,075,449 A | 6/2000 | Sinnett | |
| 6,426,859 B1 | 7/2002 | Cohen | |
| 6,866,353 B2 | 3/2005 | Wertsberger | |
| 6,873,516 B1 | 3/2005 | Epstein | |
| 7,545,621 B2 * | 6/2009 | Haddad | G06K 9/00053 |
| | | | 361/220 |
| 7,567,419 B2 | 7/2009 | Lu | |
| D606,531 S | 12/2009 | Ferrari | |
| D643,843 S | 8/2011 | Hsieh | |
| 2006/0152880 A1 | 7/2006 | Lander | |
| 2006/0263588 A1 * | 11/2006 | Handa | B82Y 30/00 |
| | | | 428/292.1 |
| 2008/0225468 A1 * | 9/2008 | Huang | H05K 9/0067 |
| | | | 361/724 |
| 2010/0203931 A1 | 8/2010 | Hynecek | |
| 2013/0033121 A1 | 2/2013 | Simpson | |
| 2014/0184237 A1 * | 7/2014 | Kunz, Jr. | G01R 31/001 |
| | | | 324/537 |
| 2014/0210676 A1 | 7/2014 | Gebert | |
| 2014/0216953 A1 | 8/2014 | Su | |

\* cited by examiner

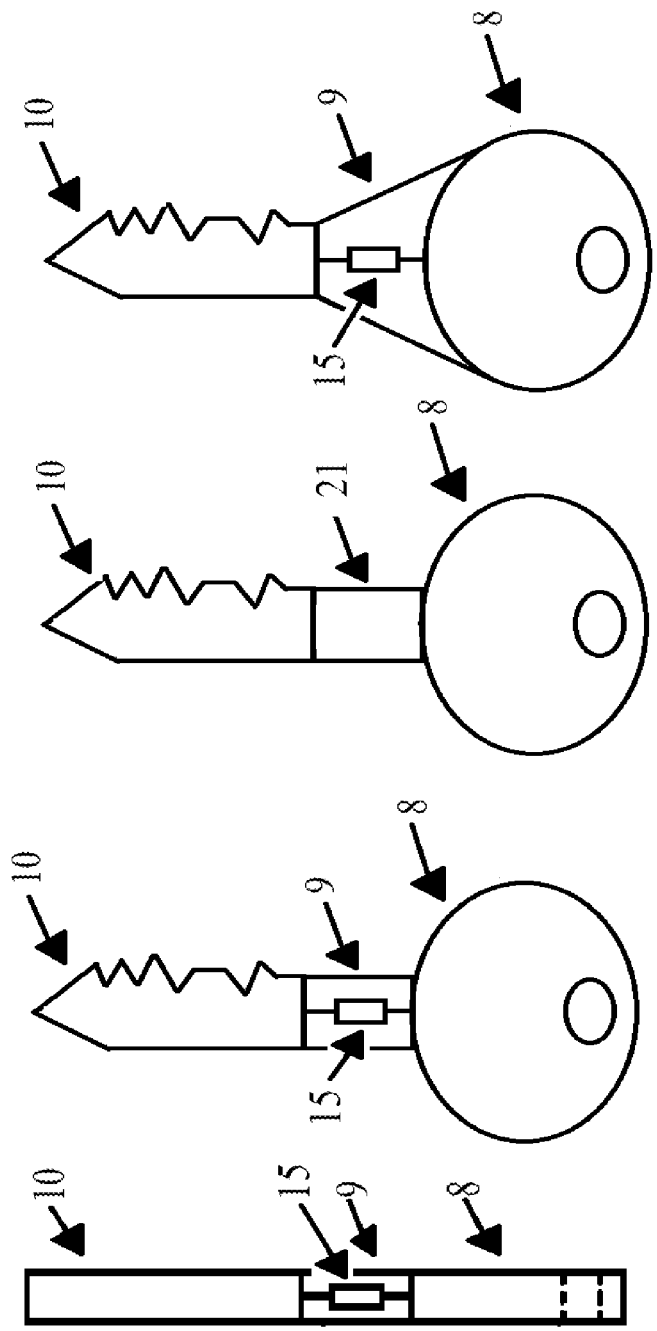

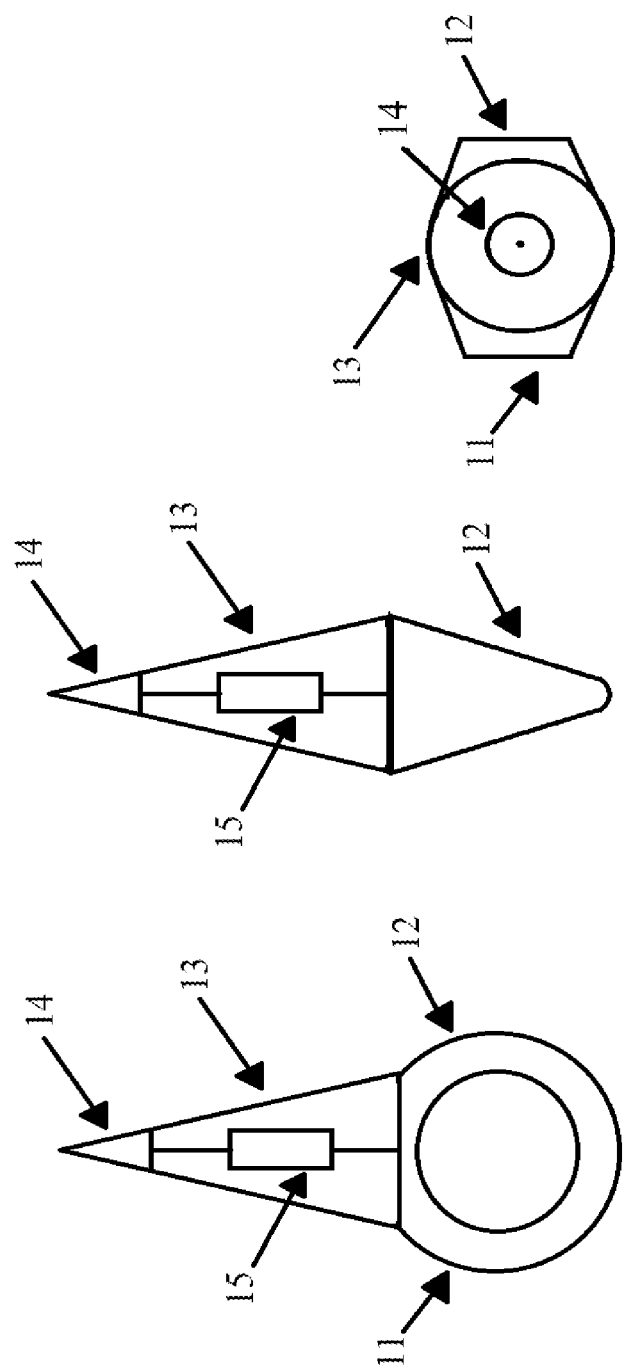

Figure 3N:
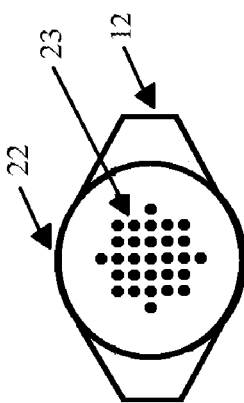
Figure 3M:
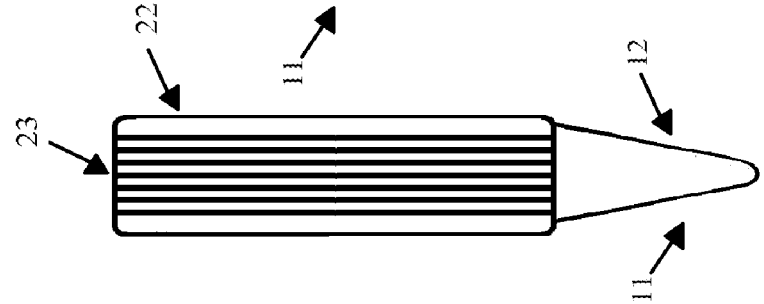

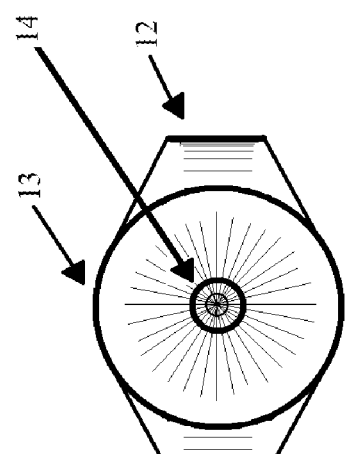
Fig. 3g
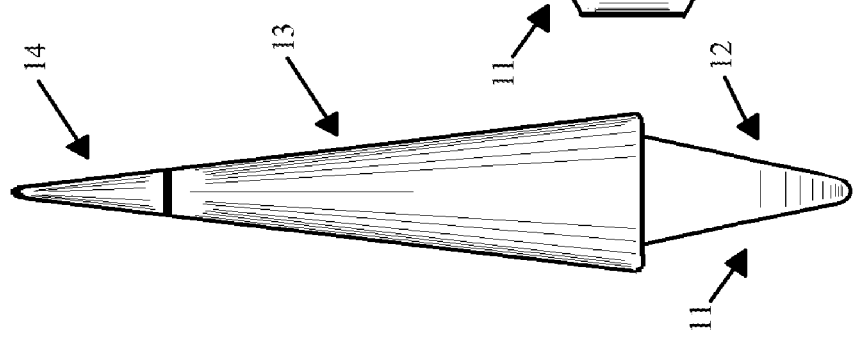
Fig. 3f
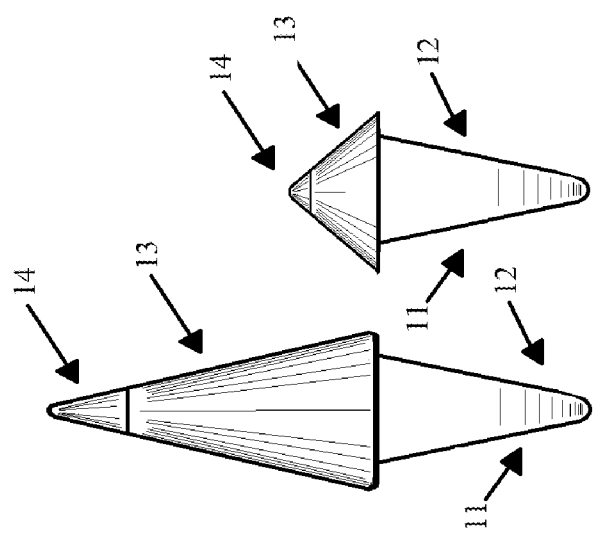
Fig. 3e
Fig. 3d

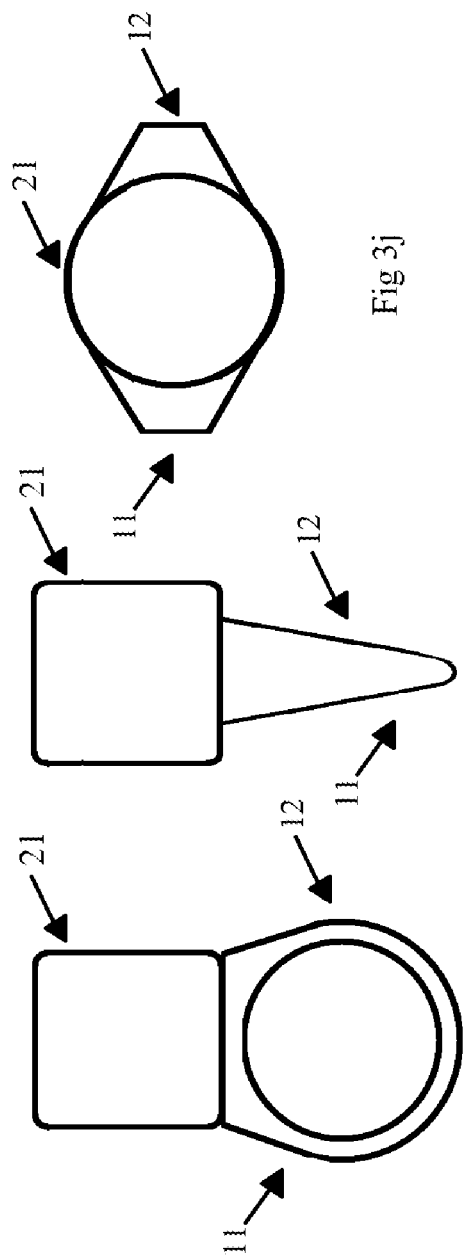

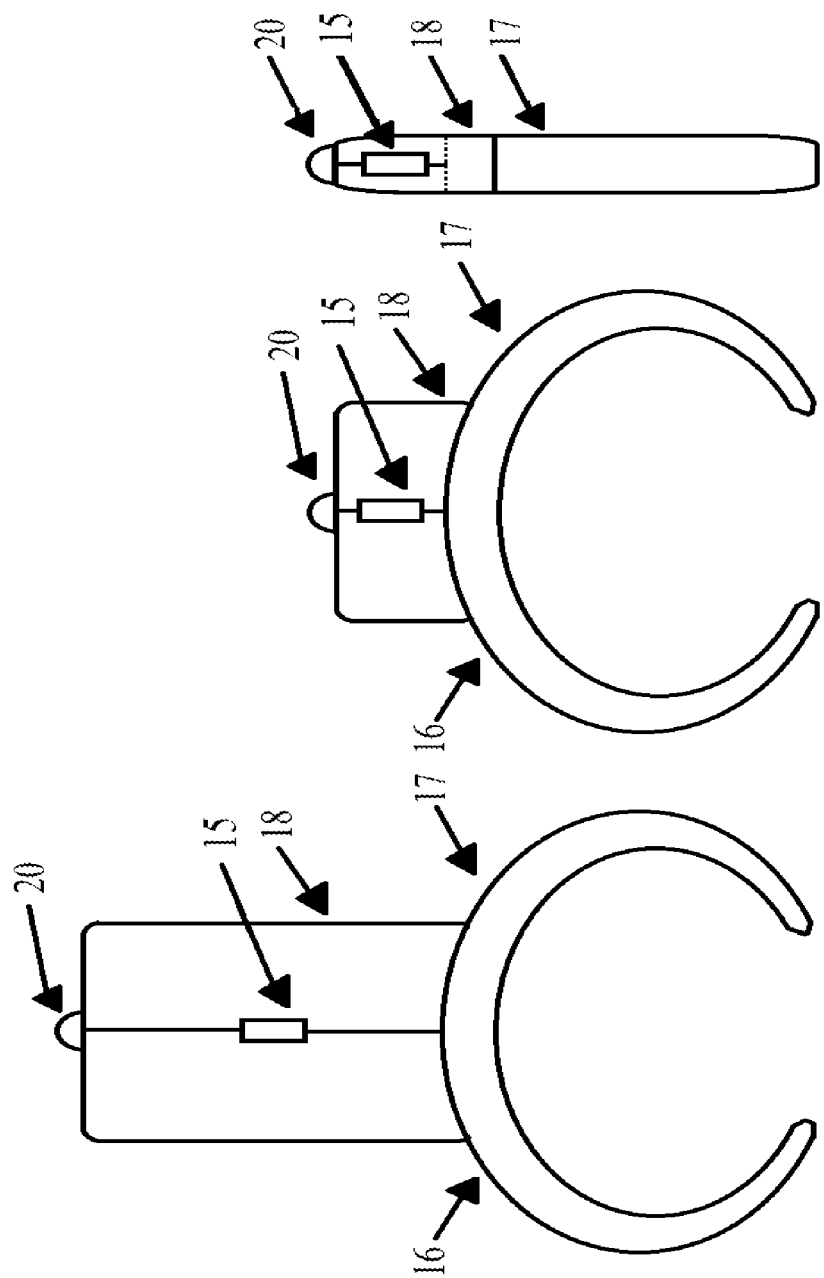

METHOD AND APPARATUS FOR MANAGING STATIC ELECTRICITY

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

Field of the Invention

The present invention relates generally to mobile devices and methods which manage or regulate static potential and flow of static electricity from one object or location to a second object or location. More particularly, the present invention relates to mobile untethered devices and methods which manage or regulate the pain inflicted upon a human being during static electricity equilibration or discharge.

Prior Art

None Known

Objects and Advantages

The build-up and accumulation of static electricity upon human beings has been a long standing problem for mankind. A mobile and untethered device to defeat static electricity has been needed. In a typical troubling scenario, said static electricity culminates in a painful sensation to a human being when said human being substantially nears an environmental object including but not limited to a door handle, light switch, clothing, or even another human being. The ensuing discharge of static electricity substantially equilibrates the electric charge potentials of two spatial locations or regions. Static electricity may accumulate near a spatial region, near elemental matter, or near an object. Electrical charge is natural, and the periodic table of elements describes various fundamental drivers for electric potential. Further more, the equilibration of electric charge potential between or among environmental masses, such as between a human being and a door knob, often causes a painful sensation to said human being if the charge transfer event is substantially unregulated with regard to what the human nervous system can typically perceive.

Historically, static electricity accumulation upon human beings has been attenuated a few ways, including: (a) Humidification of nearby air such that electrical charge may not accumulate locally in substantial quantity or spatial density, (b) installing a continuous earth grounded connection to a human being by affixing an electrically conductive wrist strap which is continuously tied to earth ground through a long conductive tether, and (c) applying electrically conductive liquid solutions, lotions, or creams, to the skin of said human being so as to help inhibit substantial charge build-up upon the human body. While these approaches may keep the human body from substantially charging in certain fixed location environments and tethered situations, a free traveling human being in the environment does not have the luxury of (a) or (b). Further, solution (c) can be uncomfortable and cumbersome, and therefore an undesirable solution for many folks. These past approaches to static electricity management have not been adequate enough, convenient enough, mobile enough, stylish enough, or inexpensive enough. A convenient mobile solution has long been needed for human beings traveling in open and uncontrolled environments. The invention presented herein is simple yet novel, stylish, inexpensive, mobile, and convenient. The present invention substantially prevents the sensation of electric shock when touching or coming substantially near a door handle, light switch, filing cabinet, sweater, another human being, pet, or other problematic environmental matter.

Folks living in cold climates appreciate the need for the present invention. Static electricity shocks during the winter months can be painful and startling. The extremely dry air created by furnace heating makes static electricity build up a daily nuisance or problem.

Advantages

The invention that this disclosure is directed has many advantages:

(a) The present invention addresses the inconvenience of requiring a lengthy stationary ground wire connection, or being tethered to local conductive flooring, in order to shunt electric charge build-ups on the human body to a dedicated Earth ground location, such as a copper rod deeply deposited into Earth soil. The present invention is advantageous in providing a mobile and floating means for managing electrical discharge events, thereby eliminating any requirement for a permanent ground wire or tethering to local conductive flooring for the shunting of static electricity to a dedicated earth ground location.

(b) Advantageous in significantly reducing the monetary expense of a solution. Financial cost is often a hurdle for sales to the public.

(c) Advantageous in being relatively easy to manufacture, especially in simplest embodiments, and as such, has much utility to human-kind and the resourceful among us.

(d) Advantageous in being aesthetically stylish. Style has a significant utility, necessity, and advantage for many folks, especially those who must care about their physical appearance or the perceptions of others in the work place or in public spaces.

(e) Advantageous in convenience, thereby having much utility and advantage for those who cannot be bothered with more complex and cumbersome approaches.

(f) Advantageous in comfort, both in wear-ability, and in the elimination of electric shock fear.

SUMMARY

The present invention is directed to methods and mobile means for managing static electricity.

Means For Managing Electrical Charge Dispersion And Equilibration (MFMECDAE) are shown in FIGS. 1, 2, 3, 4, and 5. The present invention is mobile and substantially manages the rate of electrical charge transference between two or more locations. When utilized by a human being the present invention manages the rate of static electricity charge transference to make the transfer events substantially imperceptible to the human senses. A typical method of use involves said human being installing said MFMECDAE, then substantially directing the distal portion of said MFMECDAE toward an environmental object or location which has either historically proven to result in shock to said human being, or is suspected to present a risk of shock. The present invention results in substantial attenuation of static electricity shock to said human being when said human being subsequently attempts to touch a light switch, another human being, door handle, appliance, or the like. The embodiments shown and described in FIGS. 1, 2, 3, 4, and 5, are advantageous in that they are relatively inexpensive, mobile, untethered, convenient, comfortable, stylish, and are often entertaining to have handy and utilize when needed, resulting in much utility and comfort to said human being.

Also according to the invention, method steps for utilizing mobile embodiments of the invention. These method steps result in substantial dispersion of electrical charge at rates substantially imperceptible to the human senses, without requiring a tether to a dedicated earth ground location.

Further according to the invention, a system for managing the dispersion of electrical charge, wherein the claimed system components are mobile and untethered.

These and other features, aspects, and advantages of the present invention will become better understood with reference to the following description and claims.

DRAWINGS—FIGURES

Embodiments of the invention are disclosed in the following detailed description and accompanying drawings. These embodiments and other features, aspects, and advantages of the present invention will become better understood with regard to the following description, appended claims, and accompanying drawings:

Figure Description

Figure 1A:
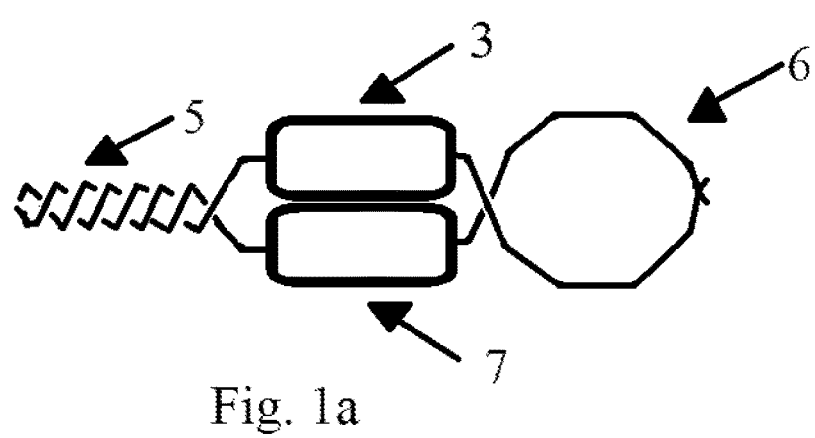

FIG. 1*a* Side View: Two axial leaded resistors formed into the invention
FIG. 1*b* Top View: Two axial leaded resistors formed into the invention
FIG. 1*c* Front View: Two axial leaded resistors formed into the invention
FIG. 1*d* Side View: One axial leaded resistor formed into the invention
FIG. 2*a* Top View: Key shaped embodiment
FIG. 2*b* Left Side View: Key shaped embodiment
FIG. 2*c* Top View: Key shaped embodiment with alternate impedance element
FIG. 2*d* Top View: Key shaped embodiment with alternate aesthetic
FIG. 2*e* Top View: Shortened key shape embodiment with alternate aesthetic
FIG. 2*f* Top View: Lengthened key shape embodiment with alternate aesthetic
FIG. 3*a* Front View: Ring embodiment
FIG. 3*b* Right Side View: Ring embodiment
FIG. 3*c* Top View: Ring embodiment
FIG. 3*d* Right Side View: Alternate ring embodiment
FIG. 3*e* Right Side View: Shortened alternate ring embodiment
FIG. 3*f* Right Side View: Lengthened alternate ring embodiment
FIG. 3*g* Top View: Alternate ring embodiment
FIG. 3*h* Front View: Ring embodiment with alternate impedance element
FIG. 3*i* Right Side View: Ring embodiment with alternate impedance element
FIG. 3*j* Top View: Ring embodiment with alternate impedance element
FIG. 3*k* Right Side View: Shortened ring embodiment with alternate impedance element
FIG. 3*l* Right Side View: Lengthened ring embodiment with alternate impedance element
FIG. 3*m* Right Side View: Ring embodiment with plurality of impedance paths
FIG. 3*n* Top View: Ring embodiment with plurality of impedance paths
FIG. 3*o* Right Side View: Ring embodiment with alternate impedance means and substantially hemispherical electrode
FIG. 3*p* Top View: Ring embodiment with alternate impedance means and substantially hemispherical electrode
FIG. 4*a* Front View: Bracelet embodiment
FIG. 4*b* Right Side View: Bracelet embodiment
FIG. 4*c* Front View: Lengthened bracelet embodiment
FIG. 4*d* Front View: Bracelet embodiment with alternate aesthetic
FIG. 4*e* Right Side View: Bracelet embodiment with alternate aesthetic
FIG. 4*f* Front View: Bracelet embodiment with alternate aesthetic and impedance element
FIG. 5*a* Top View: Electronic device embodiment
FIG. 5*b* Right Side View: Electronic device embodiment
FIG. 5*c* Bottom View: Electronic device embodiment
FIG. 5*d* Front View: Electronic device embodiment
FIG. 5*e* Bottom View: Electronic device embodiment with alternate impedance element
FIG. 5*f* Bottom View: Electronic device embodiment with alternate impedance means
FIG. 5*g* Side View: Alternate substantially hemispherical electrode assembly

DRAWINGS—REFERENCE NUMERALS

Ref. Numeral Description
1 First lead of an axial leaded resistor
2 Body of an axial leaded resistor
3 Body of first axial leaded resistor
4 Formed lead of axial leaded resistor
5 Twisted leads of two axial leaded resistors
6 Formed leads of two axial leaded resistors
7 Body of second axial leaded resistor
8 Base of key
9 Electrically insulating covering
10 Grooved end of key
11 Electrically conductive ring
12 Right side of electrically conductive ring
13 Electrically insulating covering
14 Electrically conductive tip
15 Electrically resistive or electrically impeding element
16 Electrically conductive bracelet
17 Right side of electrically conductive bracelet
18 Electrically insulating covering
19 Electrically conductive tip on a substantially hemispherical electrode
20 Electrically conductive electrode
21 Electrically resistive or electrically impeding material
22 Electrically insulating material
23 Electrically resistive pathways or electrically impeding pathways
24 First Electrode
25 Second Electrode
26 Electrically resistive or electrically impeding gas, solid, liquid, or vacuum
27 Containment for 26
28 Electronic device
29 Electrically conductive surface
30 Transparent surface region

DETAILED DESCRIPTION

The present invention to which this disclosure is directed shall now be detailed. The following paragraphs shall provide sufficient understanding to make and use the present invention. However, the invention may be practiced according to the claims without some of these specific details. FIGS. 1 through 5 depict various Means For Managing Electrical Charge Dispersion And Equilibration (MFMEC-DAE).

Preferred Embodiment

Figure 3L:
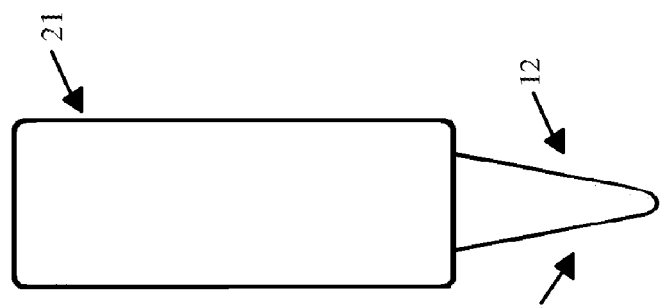
Figure 3K:
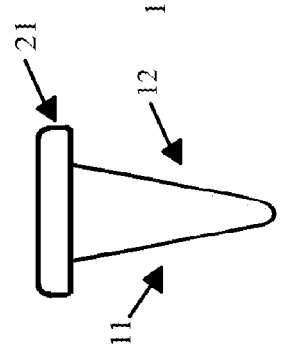
Figure 3O:
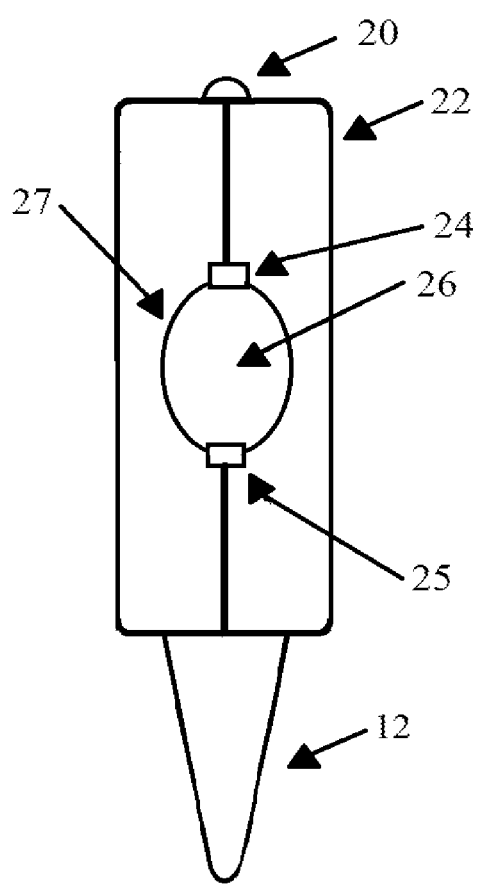
Figure 3P:
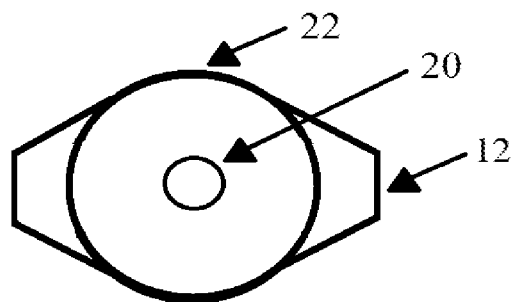

The preferred embodiment of the invention is shown in FIGS. 3a through 3p, and may be affixed on a finger, toe, thumb, grasped, or affixed to a location substantially on or near the human being using the invention.

FIGS. 3a, 3b, and 3c, depict the front view, right side view, and top view, respectively, of a ring shaped embodiment which features a substantially defined electrical pathway for electrical charge flow (11, 14, 15). A protruding mass (13, 14, 15) from the ring is substantially encapsulated with an electrically insulating covering (13), although in alternative embodiments of the invention the electrically insulating covering (13) may be physically absent.

In a preferred method of using the preferred embodiment, said human being electrically communicates with the ring (11) by affixing it upon a thumb or finger. Next, said human being electrically communicates the distal region (14) of the invention to an environmental object which has historically proven to give painful shocks or which is suspected to present a risk of shock to said human being, said human being maintaining electrical communication for an overall duration of about 1 milli-second to 10 seconds such that the electric charge upon said human being substantially flows through the electrically impeding element 15 and passes substantially to the distal region 14 of the invention and further passes substantially to said environmental object such that eventual equilibration of charge potentials between said environmental object and said human being ensues to a substantial degree. Said human is now free to engage said environmental object in an operational manner such as flicking said light switch, or turning said door knob. Since the static charge upon said human being has been substantially dispersed or equilibrated, said human being is now able to achieve comfortable interaction with said environmental object, or other nearby objects.

Note that during the ensuing discharge of static electricity, substantial electrical charge will flow in the direction dictated by the overall electric fields and overall magnetic fields which are substantially acting upon the discharge. Accordingly, over the course of the discharge or discharges the directional motion of electric charge may be multi-directional, but overall substantially equilibrating. As such, it is recognized that the motive direction of electric charge may substantially alternate through the invention during a discharge event or events, manifesting in charge flow rate variance and directional variance over some or all of the total discharge time. Electrically impeding element 15 serves to substantially regulate charge flow through the invention, and in alternate embodiments element 15 can do so in either one or more motive directions. For example, when element 15 is a resistor preferably between about 10 Kilo-ohms and 100 Mega-ohms, then said resistor substantially regulates charge flow in both directions across element 15. When element 15 is comprised of a resistor in series with a diode such as a light emitting diode (LED), then 15 will provide resistive regulation in the motive direction in which the diode or LED readily conducts. Or, when 15 is comprised of a resistor in series with a zener diode, then element 15 will provide charge flow regulation in both directions across element 15 particularly when the reverse breakdown voltage of the zener diode has been achieved and the zener diode substantially thereby conducts electricity in either reverse breakdown or forward bias directions. Preferably element 15 is a discrete resistor for simplicity, but element 15 may also be implemented as a network of electrical elements, electrical and magnetic fields, or a resistor in series with a gas such as neon, each implementation presenting substantial impedance to charge flow and thereby regulating the flow rate of charge. Neon gas may be preferred in implementations where light emission or visual notification is desired from the present invention.

One who is ordinarily skilled will appreciate the convenience and utility that this preferred embodiment provides to said human being. Said MFMECDAE can be utilized by said human being when needed. It is mobile without continuous tether to earth ground, providing substantial environmental freedom of movement for said human being to operate machinery, appliances, electronic devices, or other environmental objects necessary for daily contacted interaction.

In regard to FIGS. 3a, 3b, and 3c, the length of the electrically insulating covering (13) may be between about ¼ inch and 36 inches. Substantial lengthiness of said electrically insulating covering (13) provides additional high voltage isolation so that said human body or base portion (11) of the MFMECDAE does not substantially discharge through the peripheral air pathway thereby substantially bypassing the invention by traveling around the invention and to the light switch, door knob, etc.

One skilled in the art will appreciate that the static voltage potential developed upon said human being can vary greatly, especially versus local air humidity fluctuations from day to day. Humidity can serve to significantly lower the charged voltage potential developed upon said human being. In scenarios presenting substantially dry air, and therein potentially higher accumulated voltages upon said human body, a lengthier electrically insulating covering (13), preferably about 1 inch to 6 inches, may be preferable to inhibit substantial or undesired transference of static electric charge by way of the peripheral air around the MFMECDAE over to said light switch, door knob, etc. Accordingly, if said human being has been charged to many tens of thousands of volts, then said electrically insulating covering (13) shall be lengthy enough to stand off the high voltage and keep electrical discharge from substantially bypassing the invention and substantially taking an undesired path from human skin near the invention or MFMECDAE base (11) directly to said light switch, door knob, etc. The ideal length of the electrically insulating covering (13) is the length which provides adequate high voltage stand-off such that the charge on the human body near the invention primarily travels through the invention, rather than around the invention and via peripheral air pathway over to said light switch for example. Note that in some operative scenarios, such as lower voltage static electricity potential and high humidity, the length of the electrically insulating covering (13) may suffice to be essentially zero inches or absent. For example, in scenarios where the accumulated voltage potential upon the human body is merely hundreds of volts, or in scenarios where the user prefers to feel a slight shock sensation rather than wear a more cumbersome lengthy 6 inch embodiment.

FIGS. 3d, 3e, and 3f represent alternate right side views. FIG. 3g represents a corresponding top view. These figures depict examples of variability in the length of the MFMECDAE. The electrically insulating covering (13) nearest 11 has been alternatively extended substantially over 11 so as to be effective when substantially inhibiting the static electric charge upon the user's body near the invention from circumventing the invention and undesirably discharging around the invention and to said light switch, door knob, etc. The base diameter of the substantially conical electrically insulating covering (13) may be alternatively between about ¼ inch and 12 inches in diameter. The shape of 13 is preferably circular at its base portion nearest 11, but the base of 13 may also be a polygon shape, oval shape, or the like. FIGS. 3d through 3g have been detailed to show substantially conical embodiments of regions 13 and 14, but regions 13 and 14 may be substantially multifaceted in other alternate embodiments, including for example substantial shape of a pyramid or pyramid like shape. 13 and 14 may also be embodied as substantially spherical in shape, or substantially hemispherical, or substantially cylindrical, or the like. Further, FIGS. 3d, 3e, 3f, and 3g, depict non-transparent surfaces for regions 13 and 14, and as such, depict that element 15 is not substantially viewable through the surface of 13. In these example depictions element 15 resides beneath the surface of 13. While element 15 is depicted as not substantially viewable through the surface of 13 in FIGS. 3d, 3e, 3f, and 3g, in yet another embodiment, the static discharge event produces an emission of light from element 15 which passes outward through a substantially transparent embodiment of 13 so that static discharge event notification may be visibly signaled to a nearby human being or the like. In yet another embodiment, the discharge event produces light emission which is substantially view-able through 14, or 11. In still another embodiment, regions 13 or 14 are transparent to radio wave communication, and as such, radio wave notification of a static discharge event and its characteristics may be transmitted from the present invention to a receiving means in the local environment. Light emission from the present invention has utility in notifying nearby human beings or systems that electrical discharge of said human body has occurred and it is now safe to proceed. Further, data communication or radio wave notification from the present invention by way of light or radio waves has utility for automated systems.

Alternate Embodiments

FIGS. 3h, 3i, and 3j depict yet another embodiment. The function of element 15 is alternatively achieved here by 21. The distal portion of the MFMECDAE is comprised of a block shaped or cylinder shaped substantially electrically resistive material (21) which serves to regulate the flow of electric discharge. The over all electrical resistance presented from 11 to the distal surface of 21 is about 10 Kilo-ohms to 100 Mega-ohms, preferably 200 Kilo-ohms. When the discharge event takes place, the electrical discharge substantially passes through 21. 21 may be comprised of electrically resistive plastic, metal oxide, semiconductor material, or the like. 21 can be shaped in various diameter and length, such as depicted in FIG. 3K and FIG. 3L, with key characteristic being the over all resistance presented to the discharge event through the present invention. Element 21 may be about ¼" in diameter up to 12 inches in diameter. Substantial light emission or radio wave transmission outward from the present invention may be useful in some scenarios as disclosed earlier, therein providing informing notification that a discharge event has taken place.

FIGS. 3m, 3n, 3o, and 3p depict a slightly different variant of this embodiment wherein resistive channels (23) pass from the base (11) of the MFMECDAE to the distal surface of 22. 22 is comprised of an electrically insulating material such that the discharge event passes electricity through one or a plurality of resistive channels (23). The number of resistive channels can be from 1 to a substantial plurality. In the case of a substantial plurality of resistive pathways, either pico-meter, nano-meter, micro-meter, milli-meter, or centi-meter scale pathways may have utility. Resistivity may be achieved using carbon or carbon doped nano tubes, metal oxide, semiconductive materials, or similar. In the case of one resistive channel, FIGS. 3o and 3p depict an example embodiment wherein the resistive pathway is comprised of a gas (26) such as neon constrained within a vessel (27) containing two electrodes (24, 25) or alternatively a plurality of electrodes. The neon gas presents a substantial impedance to the flow of electricity through it, but when the voltage across the electrodes (24, 25) exceeds between about 10 volts to 100000 volts, preferably 100 volts, said neon gas conducts electricity through it and substantially emits light. As mentioned prior, a resistor may be placed in series with said neon gas in order to further resistively limit the electrical current flow through the invention. The electrical discharge travels through distal hemispherical electrode (20) substantially reaching said light switch, door knob, etc., thereby substantially discharging said human body. As with the other embodiments described, the over all electrical resistivity or electrical impedance presented by the discharge pathway is substantially key to regulating the amplitude, direction, and rate of the discharge. An electrically resistive element placed in series with the gas (24, 25, 26) may improve regulation of charge flow through the invention during a discharge event through the gas, further effectively enhancing comfort to the user by increasing the resistance presented to the discharge flow.

Figure 1C:
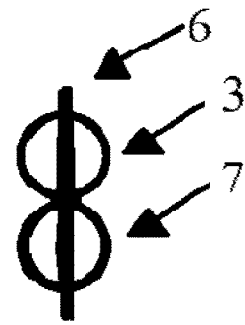
Figure 1B:
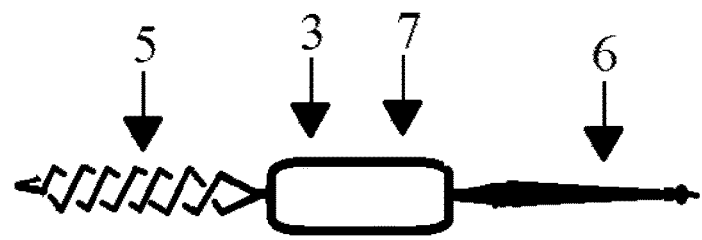
Figure 1D:
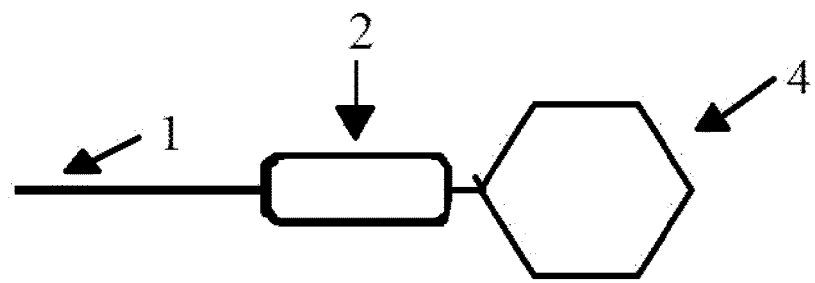

FIGS. 1a, 1b, and 1c depict the side view, top view, and rear view respectively of an alternate embodiment MFMECDAE which is formed preferably from two axial leaded discrete carbon composition resistors (3, 7) which are fashioned into a novel and aesthetic MFMECDAE. FIG. 1d depicts yet another alternate embodiment which is formed from one discrete carbon composition resistor (2) fashioned into a novel and aesthetic MFMECDAE. Metal oxide or metal film resistors (3, 7) could also be utilized in conjunction with or instead of carbon composition resistors (3, 7). FIG. 1 embodiments are fabricated by clever and novel forming of either one discrete axial leaded resistor (2), or two axial leaded resistors (3, 7) in order to create the MFMECDAE. While the embodiments in FIG. 1 cost less than a dollar for the materials, their construction into the present invention does require a few minutes to form, make, and use, with substantial effectively. In FIG. 1b, the leads of two axial leaded resistors are twisted several times together (5, 6), formed as depicted, so as to create a graspable (6) or affixable end (6) of the MFMECDAE and also a distal end (5) through which the discharge exits substantially toward an environmental object or the like such as said light switch, door knob, etc. In FIG. 1d the graspable (4) or affixable portion (4) is similarly formed and the distal portion (1) is comprised of the bare lead of the axial resistor. Alternatively the user may also substantially coat or encapsulate the distal end (1) with an electrically insulating coating or insulating sleeve such that electric charge is only allowed to transit to the peripheral environment by way of the most distal end of 1 which is uncoated or uncovered. Regarding FIGS. 1a, 1b, and 1c, this simple embodiment is preferably achieved when both resistors (3, 7) are substantially the same marked or color coded value. However one who is ordinarily skilled in the art will appreciate that the resistor bodies do not need to be the same resistive value, wattage, or length, for the MFMECDAE to provide impedance and regulate electrical flow. This is because an electrical discharge through the invention will utilize both resistors during discharge to the extent that the main electrical conduction path is the path of least resistance or least impedance. This complies with Ohm's law, which states that Voltage=Current×Resistance. When both resistors are substantially the same marked or same color coded value, the charge disperses in essentially equal manner through each of the resistors. Two resistors in parallel (FIG. 1a) electrically present an over all resistance which is essentially ½ of the individually marked or color coded resistor value. Thus, choosing an individual resistor value of 470 Kilo-ohms, essentially presents about 235 Kilo-ohms of over all D.C. Resistance between the ends (5, 6) of the MFMECDAE. 235 Kilo-ohms of over all resistance can often prove to be substantially sufficient for effective operation of the invention. ½ watt or 1 watt resistors are also often adequate. Likewise, paralleling two 1 Mega-ohm resistors results in 500 Kilo-ohms over all. As one goes lower in over all resistance between the ends (5, 6) of the MFMECDAE, one may notice that the sensation of electrical shock becomes stronger to the human senses since the magnitude of the discharge is not substantially regulated by the MFMECDAE impedance. It is well known that human senses vary from human being to human being, and electric shocks perceptible to one human being may not be perceptible to another. If the invention user chooses an over all resistor value greater than about 1 Mega-ohm to 100 Mega-ohms to attempt to further reduce pain perceived by the human senses, then the invention user may need to wait a plurality of seconds for the electrical charge on said human body to discharge to said light switch, door knob, etc.

It should also be noted that more than two resistors (3, 7) can be used to form the MFMECDAE and thereby fabricate the invention. For example, using a plurality of nano-meter, micro-meter, milli-meter, or the like, width resistive pathways, or forming the MFMECDAE from a plurality of discrete axial leaded resistors, such as a quantity of 4, 8, 16, or other effective plurality still achieving MFMECDAE dimensions which are ergonomically usable by said human being. The user may also employ a gas, a substantial vacuum, or effective network of electrical components in place of resistive elements 3 and 7 of the embodiments. Further, a neon bulb may be placed in series with the resistive elements (2, 3, 7) of the invention, thereby producing substantial light when the primary discharge takes place. These embodiments may be also be comprised in form of a stick shape in order to add further utility and ergonomics to the invention. Said stick being between about the size of a tooth pick and a baseball bat.

Figures 2E, 2F:
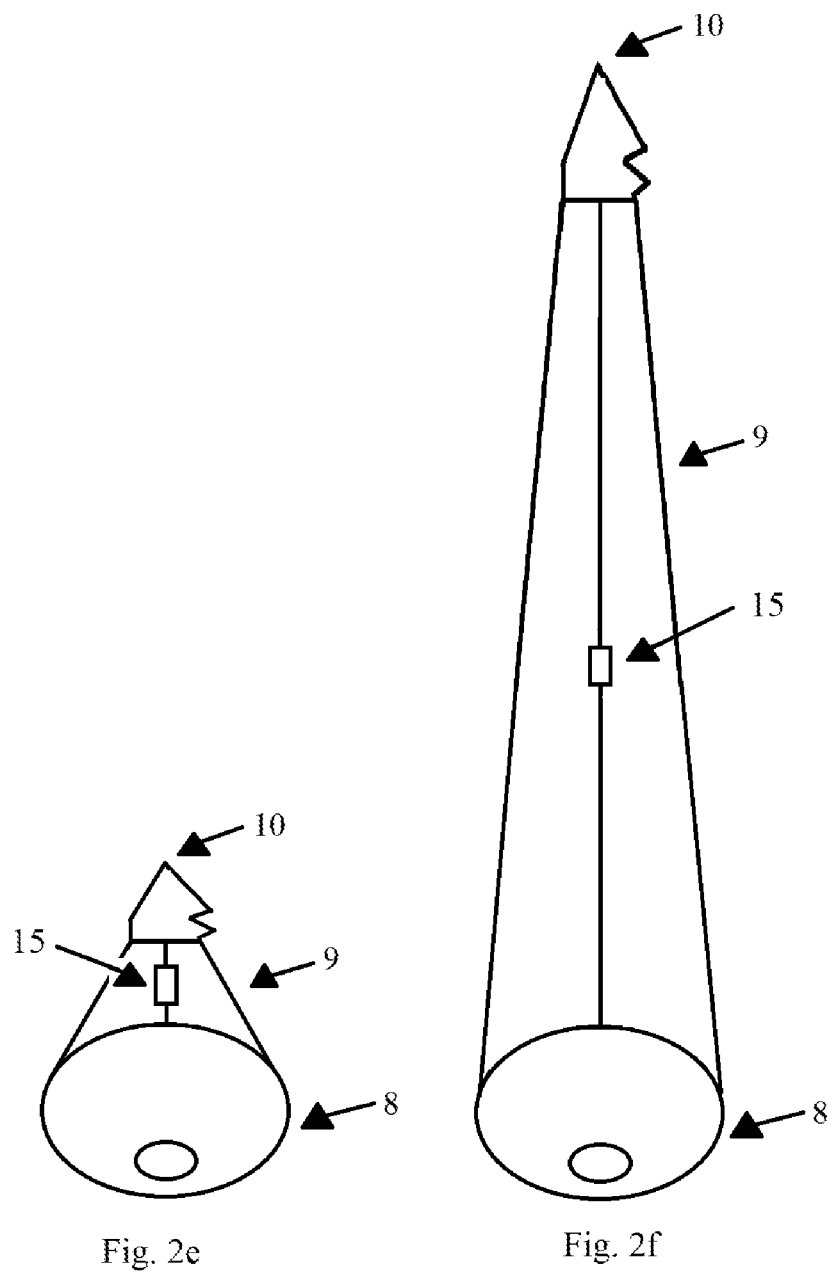

In yet another alternate embodiment, FIGS. 2a and 2b, top view and left side view respectively, depict a novel MFMECDAE in the general form and size of a common house key, luggage key, car key, or the like. This embodiment may be desirable for folks who prefer to carry keys on their belt, in their pocket, wallet, on a lanyard, in their carry bags, or the like. To use this embodiment, said human being grasps the embodiment at the electrically conductive base (8) below the electrically insulating covering (9) which houses the electrically impeding element (15). Region 9 may be formed by encapsulating 15 with an electrically insulating epoxy or the like, or with an electrically insulating covering such as plastic or the like. FIG. 2d displays an alternate shaping for 9, presenting improved aesthetic for the invention. In FIG. 2c elements 15 and 9 have been alternatively replaced with an electrically resistive material 21 such as a semiconductor material or metal oxide which provides an over all resistance for the MFMECDAE. FIG. 2e discloses a substantially shortened embodiment, which may be on the order of ½ inch in over all length, and FIG. 2f presents a substantially lengthened embodiment, which may be on the order of 36 inches in length. To use the embodiments, said human being holds the base of the key and then substantially electrically communicates the electrically conductive distal region (10) with said light switch, door knob, or otherwise. As with the prior embodiments, electrical discharge ensues, and a substantially shocking sensation for said human being is averted when said light switch is enabled, or door knob turned, etc. In substantially humid environments, a smaller dimension MFMECDAE may be quite desirable and workable, such as a key shape which is approximately ½ inch in over all length. Regions 9 and 10 may be shortened in the embodiment to be nearly non-existent such as on the order of $\frac{1}{8}^{th}$ of an inch over all. This shortened embodiment may be useful in environments where humidity is high, or when the user doesn't want to be encumbered by a more lengthy embodiment and doesn't mind feeling a slight shock when using the invention. In extremely dry and high voltage environments the embodiment could be up to 36 inches in length and region 9 accordingly lengthened so as to prevent substantial unintentional arcing around 9, or unintentional arcing between 8 and said door knob, light switch, etc. As with the other embodiments, a neon gas or the like could be utilized for 15 to produce a substantial flash of light when the static electricity discharge takes place. A resistor may also be placed in series with the gas to further regulate the discharge. And as with prior embodiments, electronically signaled notification from the invention that a discharge has occurred is also workable. Characteristics of the discharge event may be measured by micro circuits within the invention and the information transmitted by the invention to nearby automated listening devices. The discharge characteristics may include but are not limited to voltage measurement, current measurement, time duration of the discharge event, and total number of discharge events. The micro electronics necessary to accomplish this assessment may be situated in regions 9 and 15. Alternately, these measurements and implementations are also workable for all embodiments of the present invention.

Figure 4E:
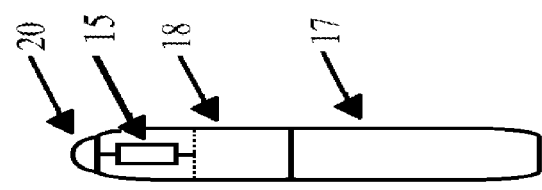
Figure 4D:
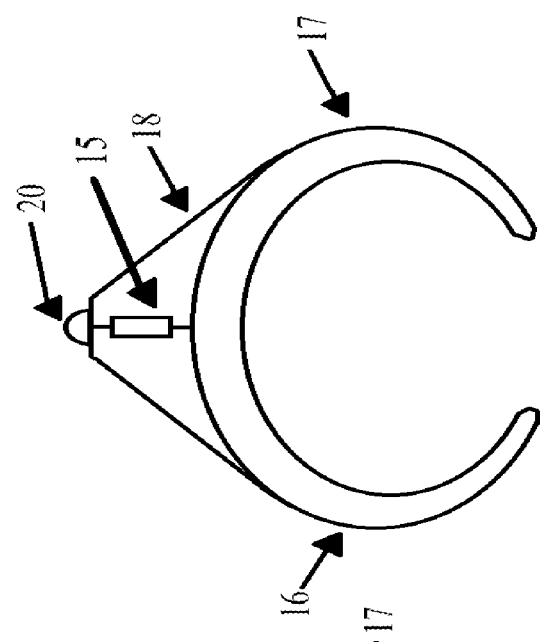
Figure 4F:
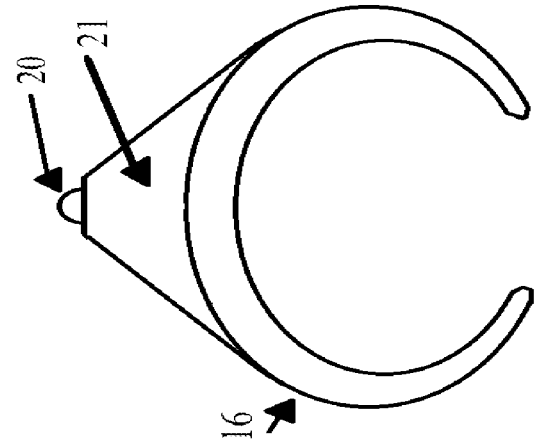

FIGS. 4a and 4b depict the front view and right side view respectively, of a MFMECDAE in the form of a wrist or ankle bracelet. The electrically conductive base ring (16) preferably possesses a split in the bracelet as shown, but in alternate embodiments the bracelet (16) may be continuous and not possess a split, or the split in 16 could be slightly wider than depicted so as to reveal nearly half the circumference of the wrist. FIG. 4 embodiments have utility to folks who do not like to wear finger rings, or carry keys, or carry sticks, and who prefer wearing or affixing a bracelet shaped MFMECDAE. Element 15 is housed in an electrically insulating covering (18). As with the previous embodiments, discharge travels substantially from the base (16) of the MFMECDAE, through the impeding element (15), and to electrode (20) at the distal end of the embodiment, and over to said light switch, door knob, or the like. FIG. 4c depicts a more lengthy embodiment such as on the order of 3 inches in length. FIG. 4d depicts a front view of more stylish region 18, and FIG. 4e depicts the right side view. In FIG. 4f, the impeding element 15 has been alternatively replaced by an electrically resistive material 21 such as a semiconductor, metal oxide, or the like. As with other embodiments, a neon gas or the like could be utilized for element 15, and a resistor may also be placed in series with the gas to improve regulation of the discharge event. As with prior embodiments, micro circuits for discharge measurement and electronic data communication means from the invention for external notification are certainly workable, the micro electronics for which may reside in regions 18 and 15.

Figure 5A:
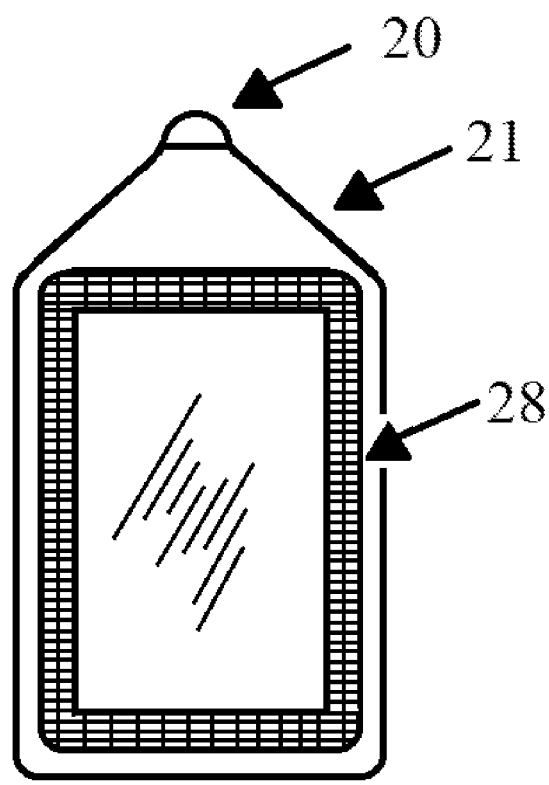
Figure 5B:
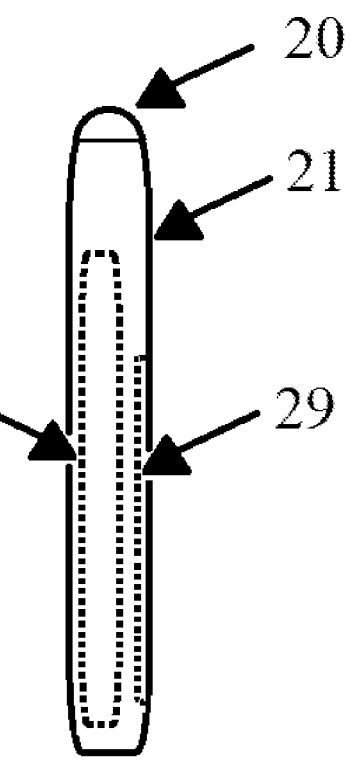
Figure 5C:
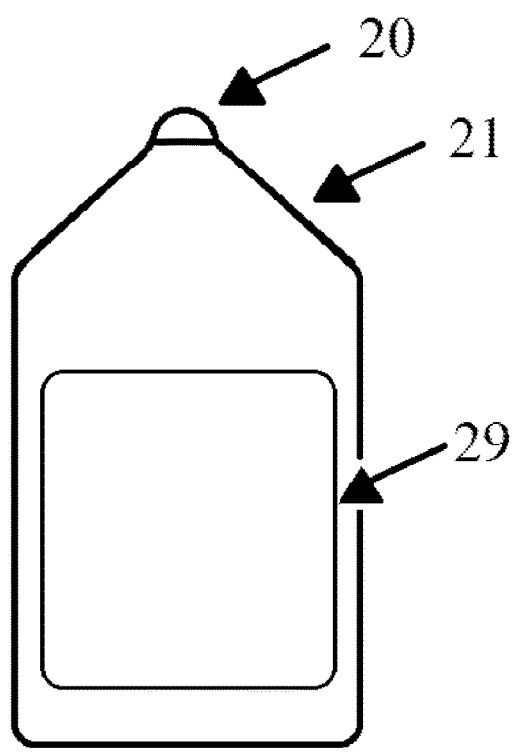
Figure 5D:
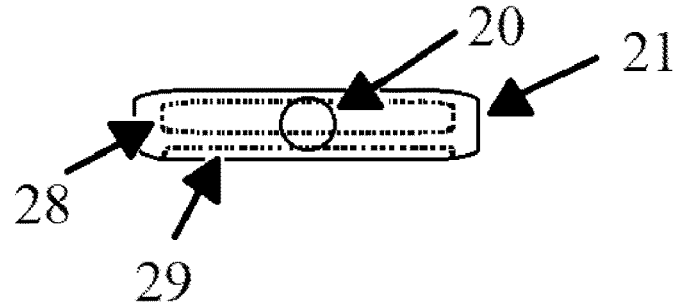
Figure 5E:
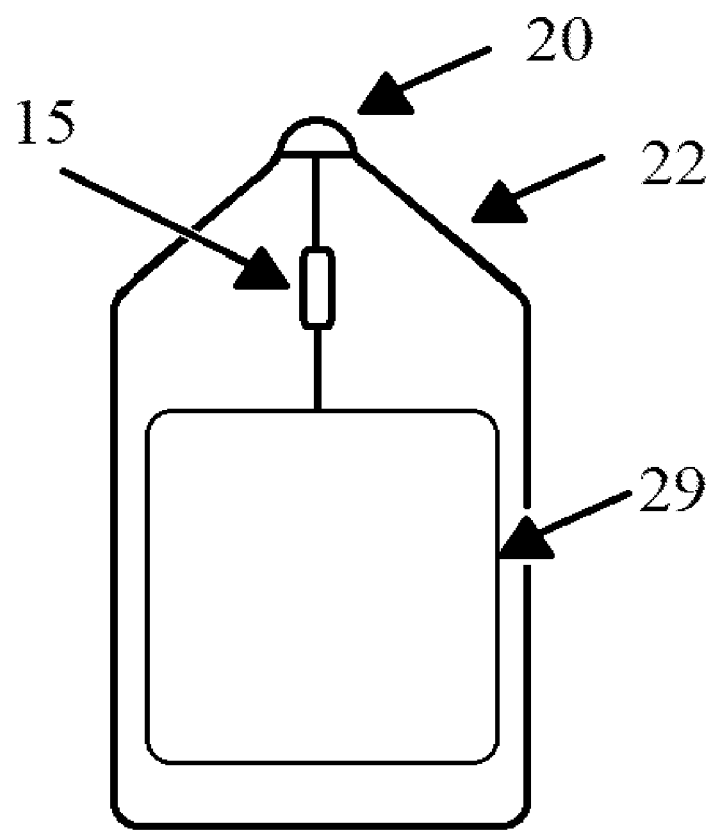
Figure 5F:
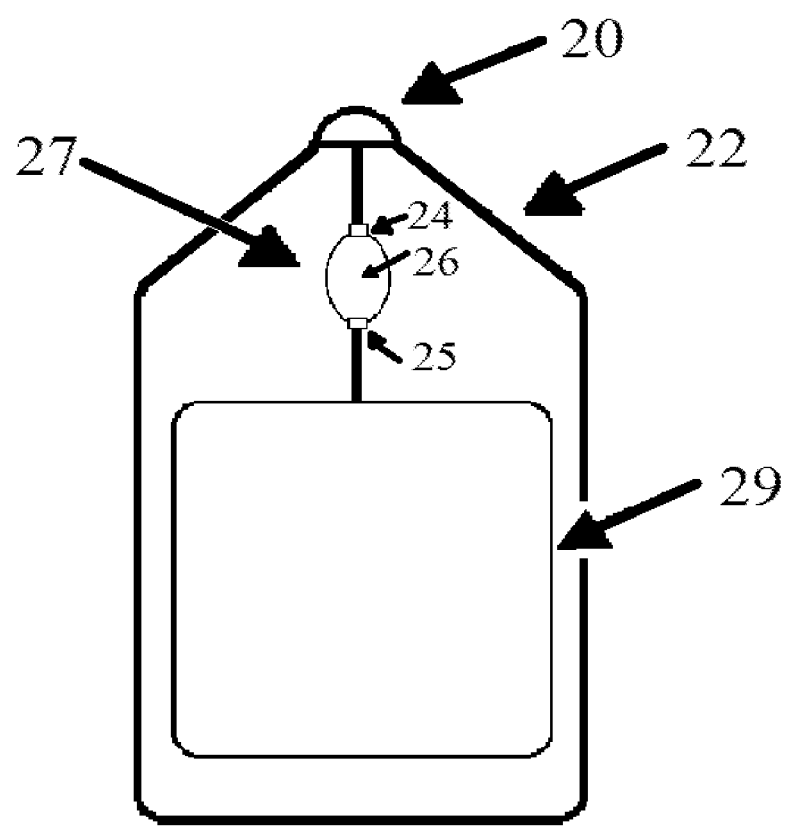
Figure 5G:
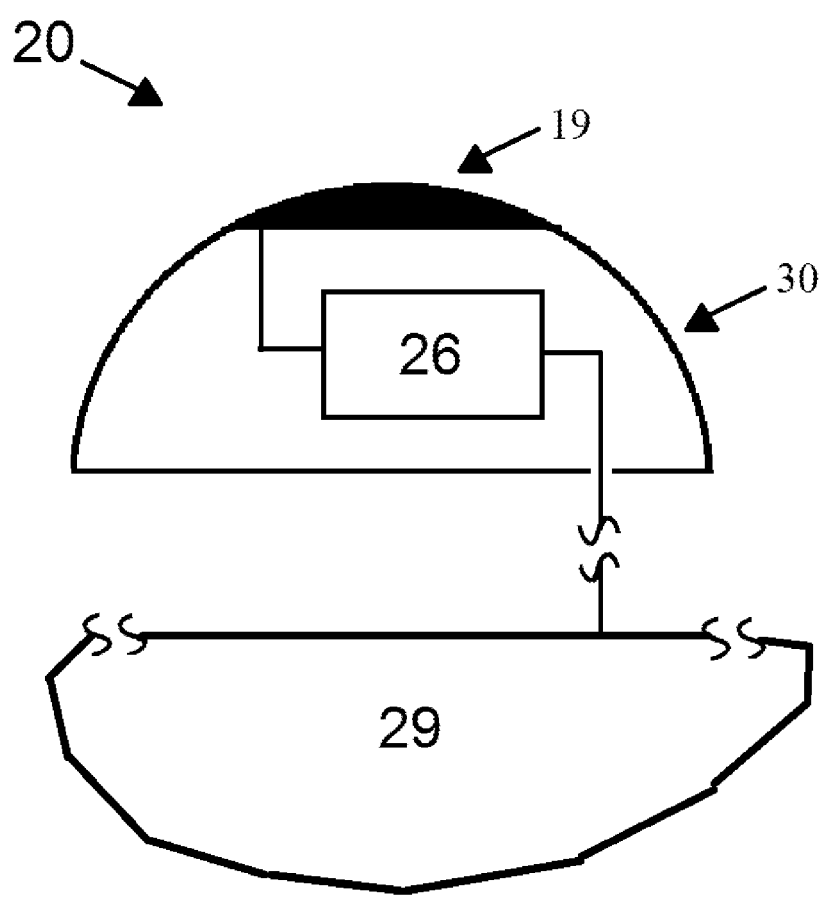

FIGS. 5*a*, 5*b*, 5*c*, and 5*d* depict top view, right side view, bottom view, and front view, respectively for a MFMECDAE incorporating an electronic device (28) which may be a computing device, cell phone or smart phone, tablet, or similar. 28 is depicted as being situated substantially on or in a housing (21) said housing made substantially of electrically resistive material (21). An electrically conductive surface (29) resides on the bottom side of the embodiment. To use the embodiment, said human being touches region 29. Substantial electrical discharge of said human being commences when the distal electrode 20 is substantially electrically communicated with said light switch, door knob, etc. The pathway for electrical discharge is primarily from region 29, through the resistive material of the housing (21), to electrode 20, and to said light switch, door knob, etc. In other words the housing (21) holding the electronic device (28) functions as the main electrically resistive or electrically impeding element. In FIG. 5*e*, the housing (22) is alternatively comprised of an electrically insulating material, wherein an electrically impeding element 15 provides the limiting impedance to the electrical discharge event. In FIG. 5*f*, a gas (26) such as neon is contained in a vessel (27) wherein two electrodes (24, 25) are utilized to enable electrical conduction through the gas. As disclosed prior, a discrete resistor may be alternatively placed in series with the gas to further increase resistance of the pathway during discharge and effectively bring more comfort to the user. The housing (22) substantially emits light when the electrical discharge takes place through the neon gas impedance (26). FIG. 5*f* depicts a slightly different distal electrode assembly (20) wherein the distal portion (19) of the substantially hemispherical assembly (20) is electrically conductive. Region 30 is transparent and able to pass light emitted from gas (26) excitation. 26 resides substantially within or substantially near the hemispherical assembly (20). In other words, a substantial portion of the hemispherical assembly (20) lights up when electrical discharge through 26 takes place. In yet another embodiment, the impeding element 26 is comprised of a light emitting diode (LED) or a resistor in series with a light emitting diode, thereby emitting light when the discharge through 26 occurs. Note that an LED may be alternatively used for light emission in any of the prior embodiments of the invention (FIGS. 1 through 5). In yet another embodiment, micro circuits to perform measurement activities and perform communication tasks are housed in 26. These micro circuits measure discharge characteristics and transmit the measured information outwardly to notify peripheral computing equipment or automated listening devices that a discharge has transpired. This feature may also be practiced according to the prior embodiments.

Preferred and alternate embodiments of the present invention have now been discussed thereby illustrating general aspects of the present invention, but the invention is not limited to any one embodiment shown in the figures. The scope of the present invention encompasses numerous alternatives, and modifications of the embodiments. As discussed, the MFMECDAE comprises a plurality of options for limiting electrical current flow, options for electrically contacting human skin, options for aesthetics, options for discharge event measurement and notification, and options relating to the format and materials comprising the invention.

One skilled in the art will appreciate that a plurality of electronic components and materials may also be utilized to implement an electrically impeding or electrically resistive element (15, 26) in order to substantially limit current flow through the invention. These alternates may be a zener diode, a light emitting diode, a transient voltage suppressor, a metal oxide varistor, a ferrite bead, a silicon controlled rectifier, an inductor, a capacitor, an electrically resistive gas, a resistive solid, a semiconductor, a transistor, a resistive liquid, an electric field, a magnetic field, a vacuum region, a plasma, or the like. Further, a network of these various elements either in series or parallel can be utilized to implement an electrical impedance for usage in the invention. A simple resistor is preferred due to said resistor's simplicity, common availability, and inexpensive nature. Due to its hearty nature neon gas is preferred in those embodiments where light emission is desired during the electrical discharge.

The present invention resides sufficiently near human skin so that charge may flow to, from, or bidirectionally between said human skin and said invention. It is not necessary that the electrical resistance between said human skin and said present invention be zero ohms. The resistance between human skin and said present invention may in fact be substantially high such as 1 mega-ohm. In such a case, it may take a plurality of seconds longer for the accumulated charge upon said human body to substantially communicate across this skin contact resistance with the present invention. One skilled in the art will appreciate that this electrical contact or electrical impedance between human skin and the invention may vary from usage to usage, and even person to person. For example, some folks perspire a lot, and as such a variance in electrical conductivity can occur when skin is wet versus when it is dry. A short air gap between human skin and the present invention may increase the time required for the charge dispersion. Highly charged static electricity may essentially jump across a short air gap, which may be present between human skin and the affixed present invention, or between distal electrode and an environmental object.

The electrically conductive distal portions of the MFMECDAE are comprised of electrically conductive materials such as metals or of semi-conducting materials. That said, in some embodiments of the invention these outward most electrodes of the invention may be the shape of a plate, thimble, bulb, donut, cylinder, cone, square, polygon, or the like. Electricity conducts to these regions either by way of a short air gap or substantially direct contact. Electrically conductive lotion or electrically conductive liquid may be placed on the skin to enhance the electrical dispersion to the present invention. Further, the present invention may also be electrically enhanced with ridges, grooves, raised bumps, or similar surface features which may improve electrical contact between human skin and the present invention, or between an environmental object and the electrodes of the present invention. One skilled in the art will appreciate that raised surface features on the inside surface of a ring or bracelet could serve to lessen electrical contact resistance between human skin and the present invention.

Various parasitic forms of electrical impedance may also be present in or near the invention. This includes parasitic inductance or parasitic capacitance which may be inherently present in the embodiment and may factor notably into the over all impedance that electricity experiences when traveling through the invention. These parasitics of the invention may provide additional current limiting of electrical flow through the invention.

Discrete axial leaded resistors are often marked or color coded by manufacturers as being a particularly fixed value, however one skilled in the art will recognize that as voltage bounces through extreme ranges across the present invention, the actual resistance of said resistor element to all frequencies of exposure, as well as DC, may not be identical to the marked value on said resistor for all moments of time during which the charge dispersion is occurring. A device such as an axial leaded resistor which is labeled as purely resistive, may also have inherent inductive (L) and inherent capacitive (C) qualities which are native to the construction of the device. Parasitic inductance, capacitance, and resistance, may vary substantially depending upon the type of resistor, physical construction, means for construction, electrical frequencies of exposure, voltage, current, and physical size.

With respect to surface mount sized electrical components, a potential challenge with surface mount resistor implementation for element 15 is the prevention of substantial high voltage arcing across the two electrodes of the relatively short length surface mount resistor. One may therefore wish to apply electrically insulative coatings to the body of the surface mount resistor, or encapsulants which mitigate electrical arcing across or around the surface mount resistor.

Environmental objects interacting with static electricity may take the form of one or more of the following: light fixture, light switch, door fixture, door knob, appliance switch, appliance body, furniture covering, furniture structure, blanket, shirt, sweater, sock, animal appendage, animal fur, biological mass, computing device, communication device, audio appliance, entertainment appliance, key, bowl, drinking glass, drinking cup, utensil, container, writing apparatus, electrical component, electrical circuit, transportation vehicle, data storage device, robot body, drone body, plasma concentration, and second human being.

Definitions

MFMECDAE=means for managing electrical charge dispersion and equilibration

CONCLUSION, RAMIFICATIONS, AND SCOPE

The disclosed embodiments are illustrative, not restrictive. While specific embodiments of the invention have been described, it is understood that the invention can be appreciated in a variety of environmental circumstances, means, systems, and methods. Although the present invention has been described in considerable detail with reference to certain preferred versions thereof, other versions are possible. Therefore, the spirit and scope of the appended claims should not be limited to the description of the preferred versions contained therein.

The reader's attention is directed to all papers and documents which are filed concurrently with this specification and which are open to public inspection with this specification, and the contents of all such papers and documents are incorporated herein by reference. All features disclosed in this specification (including any accompanying claims, abstract, and drawings) may be replaced by alternative features serving the same, equivalent or similar purpose, unless expressly stated otherwise. Unless expressly stated otherwise, each feature disclosed is one example only of a generic series of equivalent or similar features.

I claim:

1. An apparatus for managing static electricity comprising:
    A housing,
    Said housing possessing a substantial cavity,
    Said cavity sized to substantially receive or substantially hold an object,
    Said object selected from computing device group consisting of cell phone, smart phone, and tablet
    A functional first electrode or charge transfer region outwardly disposed from the front region of said housing,
    Said front region of said housing possessing shape selected from the group consisting of pyramid, trapezoid, and cone,
    Said first electrode or charge transfer region possessing shape selected from the group consisting of hemisphere, plate, thimble, bulb, donut, cylinder, cone, square, and polygon.

2. The apparatus according to claim 1 further comprising:
    Said housing possessing an effective electrical impedance which manages flow of electric discharge.

3. The apparatus according to claim 1 further comprising:
    A regional location or plurality of locations on said housing serving as a second electrode or plurality of electrodes.

4. The apparatus according to claim 1 further comprising:
    An electrically conductive surface outwardly disposed from the bottom region of said housing
    Said electrically conductive surface being a second electrode.

5. The apparatus according to claim 1 further comprising:
    An electrically conductive surface outwardly disposed from the bottom region of said housing,
    Said electrically conductive surface effectively being a second electrode,
    An electrical impedance in the range of 0.1 ohms to 100 mega-ohms electrically tying said first electrode or said charge transfer region to said second electrode.

6. The apparatus according to claim 1 further comprising:
    An electrically conductive surface outwardly disposed from the bottom region of said housing, Said electrically conductive surface possessing between one and a plurality of outwardly disposed surface features which serve to effectively enhance electrical contact to a user of the present invention.

7. The apparatus according to claim 1 further comprising:
    Said housing substantially possessing electrically insulating properties.

8. The apparatus according to claim 1 further comprising:
    Said housing possessing effective optical transparency for optical transmissions.

9. The apparatus according to claim 1 further comprising:
    Said first electrode possessing effective optical transparency for optical transmissions.

10. The apparatus according to claim 1 further comprising:
    A data communication or notification means residing in said housing.

11. The apparatus according to claim 1 further comprising:
    Said first electrode substantially possessing shape selected from the group consisting of hemisphere, plate, thimble, bulb, donut, cylinder, cone, square, and polygon.

12. The apparatus according to claim 1 further comprising:
   Said first electrode being substantially hemispherical shape,
   Said first electrode possessing effective optical transparency for optical transmissions.

13. The apparatus according to claim 1 further comprising:
   An electrically conductive surface outwardly disposed from the bottom region of said housing,
   Said electrically conductive surface effectively being a second electrode,
   A discharge measurement means connected between said first electrode or said charge transfer region and said second electrode.

14. The apparatus according to claim 1 further comprising:
   An informational communication or notification means residing in or substantially near an electrode.

15. The apparatus according to claim 1 further comprising:
   A network of electronic componentry on or in said housing to manage static discharge and informational communications.

16. An apparatus for managing static electricity comprising: A housing, Said housing sized to accommodate a computing device selected from the group consisting of smart phone, cell phone and tablet, said housing possessing substantially trapezoidal, conical, or triangular shaped frontal extension for maintaining effective electrical discharge standoff range between an electrically charged human being and electrode discharge location such that discharge of said human being may not substantially circumvent the present invention by way of substantial peripheral pathway travel, at least one electrode positioned distally on said housing extension.

17. The apparatus according to claim 16 further comprising: Said frontal extension further comprising a substantially hemispherical shaped discharge electrode distally positioned.

18. The apparatus according to claim 16 further comprising:
   An informational communication or notification means residing in or substantially near said housing.

19. An apparatus for managing static electricity comprising: a substantially hemispherical shape electrode assembly positioned distally on a housing sized to accommodate a computing device selected from the group consisting of smart phone, cell phone, and tablet, said electrode assembly comprising a substantially optically transparent and hemispherical shaped main body, said main body containing or acting as an electrical impedance element, said electrical impedance element electrically connected to a distally positioned sub-hemispherical shaped electrode, said sub-hemispherical shaped electrode positioned substantially atop said hemispherical main body.

20. The apparatus according to claim 19 further comprising:
   Circuits to measure electrical charge characteristics and communicate information.

* * * * *